(12) United States Patent
Huang

(10) Patent No.: US 11,099,233 B2
(45) Date of Patent: Aug. 24, 2021

(54) CHIP ABNORMALITY DETECTING CIRCUIT AND CHIP ABNORMALITY DETECTING DEVICE

(71) Applicants: HKC Corporation Limited, Guangdong (CN); Chongqing HKC Optoelectronics Technology Co., Ltd., Chongqing (CN)

(72) Inventor: Xiaoyu Huang, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 171 days.

(21) Appl. No.: 16/487,432

(22) PCT Filed: Nov. 16, 2018

(86) PCT No.: PCT/CN2018/115877
§ 371 (c)(1),
(2) Date: Aug. 20, 2019

(87) PCT Pub. No.: WO2020/073426
PCT Pub. Date: Apr. 16, 2020

(65) Prior Publication Data
US 2021/0148969 A1    May 20, 2021

(30) Foreign Application Priority Data

Oct. 8, 2018   (CN) .......................... 201811170740.4

(51) Int. Cl.
*G01R 31/26* (2020.01)
*G01R 31/28* (2006.01)

(52) U.S. Cl.
CPC .............................. *G01R 31/2886* (2013.01)

(58) Field of Classification Search
CPC .... G01R 31/26; G01R 31/27; G01R 31/2607; G01R 31/2621; G01R 31/2642; G09G 3/36; G09G 3/3611; H01L 23/60; H01L 27/0248; H01L 27/0285; H02H 9/046; H02H 9/041; H03K 17/0822
See application file for complete search history.

(56) References Cited

U.S. PATENT DOCUMENTS

| 2014/0043040 | A1* | 2/2014 | Deng | ..................... G01R 31/70 324/538 |
| 2016/0259220 | A1* | 9/2016 | Huang | ................. G09G 3/3611 |

FOREIGN PATENT DOCUMENTS

| CN | 101988946 A | 3/2011 |
| CN | 102105016 A | 6/2011 |
| CN | 102213733 A | 10/2011 |
| CN | 102651046 A | 8/2012 |
| CN | 102830323 A | 12/2012 |
| CN | 103278723 A | 9/2013 |
| CN | 104008743 A | 8/2014 |
| CN | 105047664 A | 11/2015 |
| KR | 20140002965 A | 1/2014 |

* cited by examiner

*Primary Examiner* — Minh N Tang

(57) ABSTRACT

The present disclosure discloses a chip abnormality detecting circuit and a chip abnormality detecting device. The circuit includes an abnormal signal detecting circuit configured to detect a reverse cutoff characteristic of an electrostatic discharge (ESD) protection diode of the chip to be detected, and output a corresponding detection signal.

13 Claims, 3 Drawing Sheets

CHIP ABNORMALITY DETECTING CIRCUIT AND CHIP ABNORMALITY DETECTING DEVICE

CROSS REFERENCE TO RELATED APPLICATIONS

The present disclosure is the National Stage of International Application with No. PCT/CN2018/115877, filed on Nov. 16, 2018, which claims the priority of Chinese Patent Application with No. 201811170740.4, entitled "CHIP ABNORMALITY DETECTING CIRCUIT AND CHIP ABNORMALITY DETECTING DEVICE", filed on Oct. 8, 2018, which is hereby incorporated by reference in its entirety.

TECHNICAL FIELD

The present disclosure relates to the field of test devices, in particular, to a chip abnormality detecting circuit and a chip abnormality detecting device.

BACKGROUND

In the display driver architecture, an ESD protection diode is generally disposed in a chip such as a timing controller or a power management chip. When there is an abnormality in the external environment, the electrostatic protection diode is abnormal, which will cause the electrostatic protection of the chip to fail, it is usually necessary to detect the ESD protection diode.

At present, a commonly used method is to detect whether an abnormality is caused by a screen display, and to analyze whether an ESD protection diode is abnormal according to an abnormal characteristic, but this method for detecting the structure is not intuitive; the other method is to use a hand-held multimeter and other measuring tools to detect, which in turn requires a lot of manpower and has low detection efficiency.

SUMMARY

The main purpose of the present disclosure is to provide a chip abnormality detecting circuit and a chip abnormality detecting device, which aim to solve the automatic detection of the characteristic value of the diode corresponding to the test ESD protection diode.

In order to achieve the above purpose, the present disclosure provides a chip abnormality detecting circuit, applied to abnormality detection of a chip disposed with an ESD protection diode, the chip abnormality detecting circuit includes:

a test power configured to provide a test current to the chip to be tested;

a connector including a signal output terminal and a ground terminal, the signal output terminal being configured to connect a function pin of the chip to be tested and a cathode of the ESD protection diode, the ground terminal being configured to connect a ground pin of the chip to be tested and an anode of the ESD protection diode;

a power switching circuit disposed in series between the test power and the signal output terminal of the connector, the power switching circuit being configured to output the test current provided by the test power to the signal output terminal of the connector when turned on; and an abnormal signal detecting circuit, of which a detection end is connected to an input end of the power switching circuit, configured to detect a reverse cutoff characteristic of the ESD protection diode of the chip to be tested, and output a corresponding detection signal.

Optionally, the chip abnormality detecting circuit further includes a screen detecting switching circuit; an input end of the screen detecting switching circuit is configured to be accessed to a screen detection signal, and an output end of the screen detecting switching circuit is connected to the signal output terminal of the connector; the screen detecting switching circuit is configured to output the accessed screen detection signal to the signal output terminal of the connector when turned on.

Optionally, the chip abnormality detecting circuit further includes a switch control circuit, and an output end of the switch control circuit is respectively connected to a controlled end of the power switching circuit and a controlled end of the screen detecting switching circuit; the switch control circuit is configured to output a first level signal and a second level signal having mutually opposite polarities to control the power switching circuit to be turned on when receiving the first level signal and to control the screen detecting switching circuit to be turned on when receiving the second level signal.

Optionally, the switch control circuit includes a DIP switch, and the DIP switch is configured to output the first level signal or the second level signal when triggered.

Optionally, the screen detecting switching circuit includes a first switch transistor; an input end of the first switch transistor is the input end of the screen detecting switching circuit, an output end of the first switch transistor is the output end of the screen detecting switching circuit, and a controlled end of the first switch transistor is the controlled end of the screen detecting switching circuit.

Optionally, the power switching circuit includes a second switch transistor; an input end of the second switch transistor is the input end of the power switching circuit, an output end of the second switch transistor is the output end of the power switching circuit, and a controlled end of the second switch transistor is the controlled end of the power switching circuit.

Optionally, the abnormal signal detecting circuit includes a light emitting diode; an anode of the light emitting diode is connected to a positive output end of the power supply, and a cathode of the light emitting diode is a detecting end of the abnormal signal detecting circuit.

Optionally, the number of the signal output terminal is plural;

the power switching circuit includes a plurality of power switching branches, and the output ends of the plurality of power switching branches are connected with the plurality of power switching branches one-to-one; and the abnormal signal detecting circuit includes a plurality of abnormal signal detecting branches, and the detecting end of each of the abnormal signal detecting branches is connected with the input end of one of the power switching branches.

The present disclosure further provides a chip abnormality detecting circuit, applied to abnormality detection of a chip disposed with an ESD protection diode, the chip abnormality detecting circuit includes:

a test power configured to provide a test current to the chip to be tested;

a connector including a ground terminal and a plurality of signal output terminals, the plurality of signal output terminals being configured to connect a plurality of function pins of the chip to be tested and cathodes of a plurality of ESD protection diodes, the ground terminal being configured to connect a ground pin of the chip to be tested and an anode of the ESD protection diode;

a power switching circuit including a plurality of second switch transistors, and the output ends of the plurality of second switch transistors are connected in one-to-one correspondence with the plurality of signal output terminals; each of the second switch transistors is configured to output the test current provided by the test power to the signal output terminal corresponding to the connector, when turned on; and an abnormal signal detecting circuit including a plurality of light emitting diodes; an anode of each of the light emitting diodes is connected to a positive output end of the power supply, and the cathodes of the plurality of the light emitting diodes are connected in one-to-one correspondence with the input ends of the plurality of the second switching transistors.

The present disclosure further provides a chip abnormality detecting device, which includes the chip abnormality detecting circuit as described above; the chip abnormality detecting circuit includes: a test power configured to provide a test current to the chip to be tested; a connector including a signal output terminal and a ground terminal, the signal output terminal being configured to connect a function pin of the chip to be tested and a cathode of the ESD protection diode, the ground terminal being configured to connect a ground pin of the chip to be tested and an anode of the ESD protection diode; a power switching circuit disposed in series between the test power and the signal output terminal of the connector, the power switching circuit being configured to output the test current provided by the test power to the signal output terminal of the connector when turned on; an abnormal signal detecting circuit, of which a detection end is connected to an input end of the power switching circuit, configured to detect a reverse cutoff characteristic of the ESD protection diode of the chip to be tested, and output a corresponding detection signal.

By disposing a connector, the present disclosure connects sequentially the test power, the abnormal signal detecting circuit and the power switching circuit to the cathode of the ESD protection diode through the connector, the cathode of the ESD protection diode and the anode of the ESD protection diode, and when the power switching circuit is turned on, the test current provided by the test power forms a current loop with the test power source, the abnormal signal detection circuit, and the power switching circuit via the ESD protection diode to test the reverse cutoff characteristic of the ESD protection diode of the chip to be tested while outputting a corresponding detection signal. In the present disclosure, the automatic detection of the characteristic value of the diode corresponding to the ESD protection diode may be realized without a hand-held measuring tool. Moreover, in the present disclosure, by disposing the abnormal signal detecting circuit in series in the detecting loop, the test worker may intuitively know the detection result and the detection efficiency is improved.

BRIEF DESCRIPTION OF THE DRAWINGS

In order to illustrate the technical schemes in the embodiments of the present disclosure or in the prior art more clearly, the drawings which are required to be used in the description of the embodiments or the prior art are briefly described below. It is obvious that the drawings described below are only some embodiments of the present disclosure. It is apparent to those of ordinary skill in the art that other drawings may be obtained based on the structures shown in accompanying drawings without inventive effort.

DESCRIPTION OF THE REFERENCE NUMERALS

Figure 1:
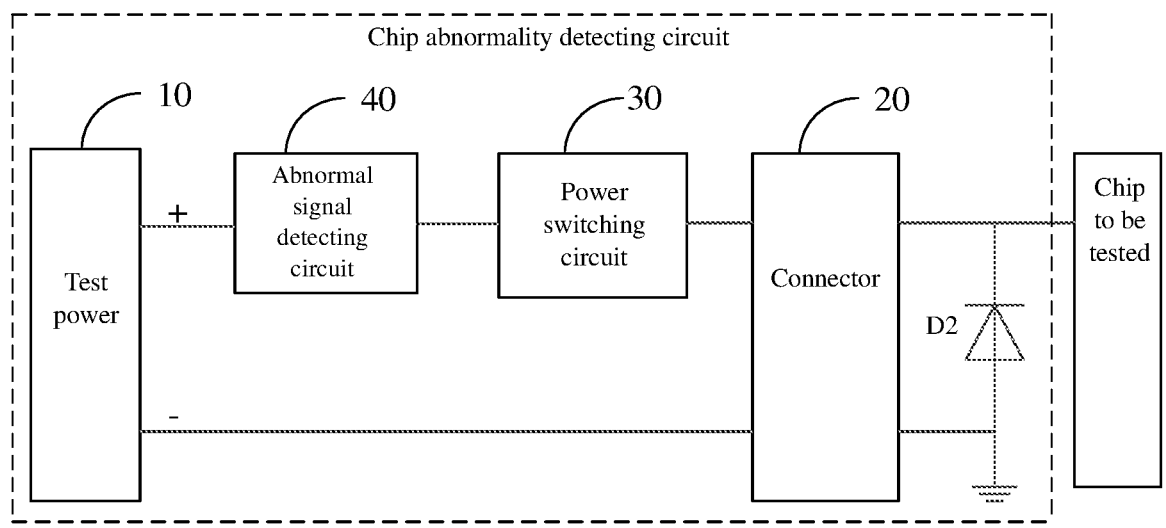
FIG. 1 is a functional block view of an embodiment of a chip abnormality detecting circuit of the present disclosure.

| Label | Name |
|---|---|
| 10 | Test power |
| 20 | Connector |
| 30 | Power switching circuit |
| 40 | Abnormal signal detecting circuit |
| 50 | Screen detecting switching circuit |
| 60 | Switch control circuit |
| Q1 | First switching transistor |
| Q2 | Second switching transistor |
| D1 | Light emitting diode |
| D2 | ESD protection diode |

With reference to the drawings, the implement of the object, features and advantages of the present disclosure will be further illustrated in conjunction with embodiments.

DETAILED DESCRIPTION OF EMBODIMENTS

The technical solutions in the embodiments of the present disclosure will be clearly and completely described hereafter in connection with the embodiments of the present disclosure. It is apparent that the described embodiments are just a part of the embodiments of the present disclosure, but not the whole. Based on the embodiments of the present disclosure, all the other embodiments obtained by that of ordinary skill in the art without inventive effort are within the scope of the present disclosure.

It should be noted that if the embodiments of the present disclosure relates to directional indications (such as up, down, left, right, front, back, . . . ), they are only used to explain the relative positional relationship, motion situation and the like between components in a certain posture (as shown in the drawings), if the specific posture changes, the directional indication shall also change accordingly.

In addition, if the embodiments of the present disclosure relates to the descriptions of "first", "second" and the like, they are only used for the purpose of description only, and are not to be construed as indicating or implying their relative importance or implicitly indicating the number of technical features indicated. Thus, features defined with "first", "second" may include at least one such feature, either explicitly or implicitly. In addition, the technical solutions between the various embodiments may be combined with each other, provided that those skilled in the art can implement it, and when the combination of the technical solutions is contradictory or impossible to implement, it should be considered that the combination of these technical solutions does not exist, nor is it within the scope of protection required by this application.

The present disclosure provides a chip abnormality detecting circuit applied to abnormality detection of a chip disposed with an ESD protection diode. The chip disposed with the ESD protection diode may be suitable for use in a display device, a timing controller (TCON IC) or a Power Management Integrated Circuit (PMIC) that drives the display panel to operate; the timing controller and power management integrated chip is generally disposed on the timing control board, that is, the TCON board.

In the production process, most of the display panels require to be detected for screen abnormality. During the detection process, the data signal, the control signal and other driving signals for driving the display panel to operate may be output to the timing controller, so that the timing controller generates a corresponding timing control signal according to the received signals, thereby driving the display panel to operate; or the AC power/DC power is output to the power management integrated chip, so that the power management integrated chip is converted into a corresponding driving voltage, thereby driving the display panel to operate.

In order to prevent externally connected static damage to the timing controller or the power management integrated chip, an electrostatic (ESD) protection diode is generally disposed. The ESD protection diode is integrated in a chip, and a timing controller and a power management integrated chip are disposed on the TCON board, and is connected to the chip pin. Or, a plurality of ESD protection diodes may also be disposed on the TCON board to protect the chip from static electricity. When the circuit is working normally, it is in the cut-off state (high-resistance state) and may not affect the normal operation of the line. For example, when an abnormal overvoltage occurs in the circuit and reaches its breakdown voltage, the ESD protection diode rapidly changes from a high-resistance state to a low-resistance state, providing a low-resistance conduction path for the instantaneous current while clamping the abnormal high voltage within a safe level, thereby protecting the chip to be protected; when the abnormal overvoltage disappears, it returns to the high-resistance state and the circuit operates normally.

When there is an abnormality in the external environment, the electrostatic protection diode is abnormal, which will cause the electrostatic protection of the chip to fail, it is usually necessary to detect the ESD protection diode. At present, a commonly used method is to detect whether an abnormality is caused by a screen display, and to analyze whether an ESD protection diode is abnormal according to an abnormal characteristic, but this method for detecting the structure is not intuitive and requires the staff to know based on experience or a large amount of data analysis; the other method is to measure the characteristic value of the diode corresponding to the ESD protection diode by the multimeter, which in turn requires a lot of manpower and has low detection efficiency.

Figure 2:
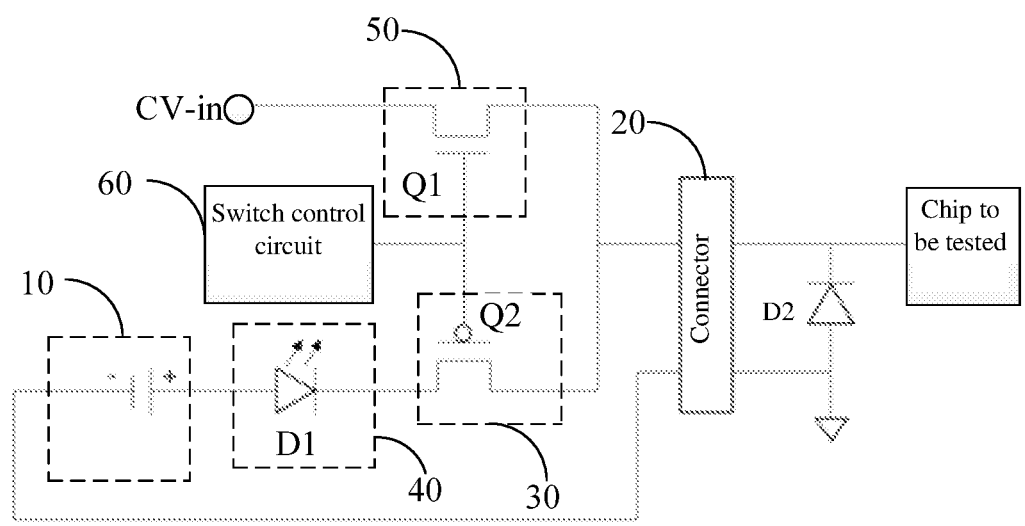
FIG. 2 is a circuit view of an embodiment of a chip abnormality detecting circuit of the present disclosure.
Figure 3:
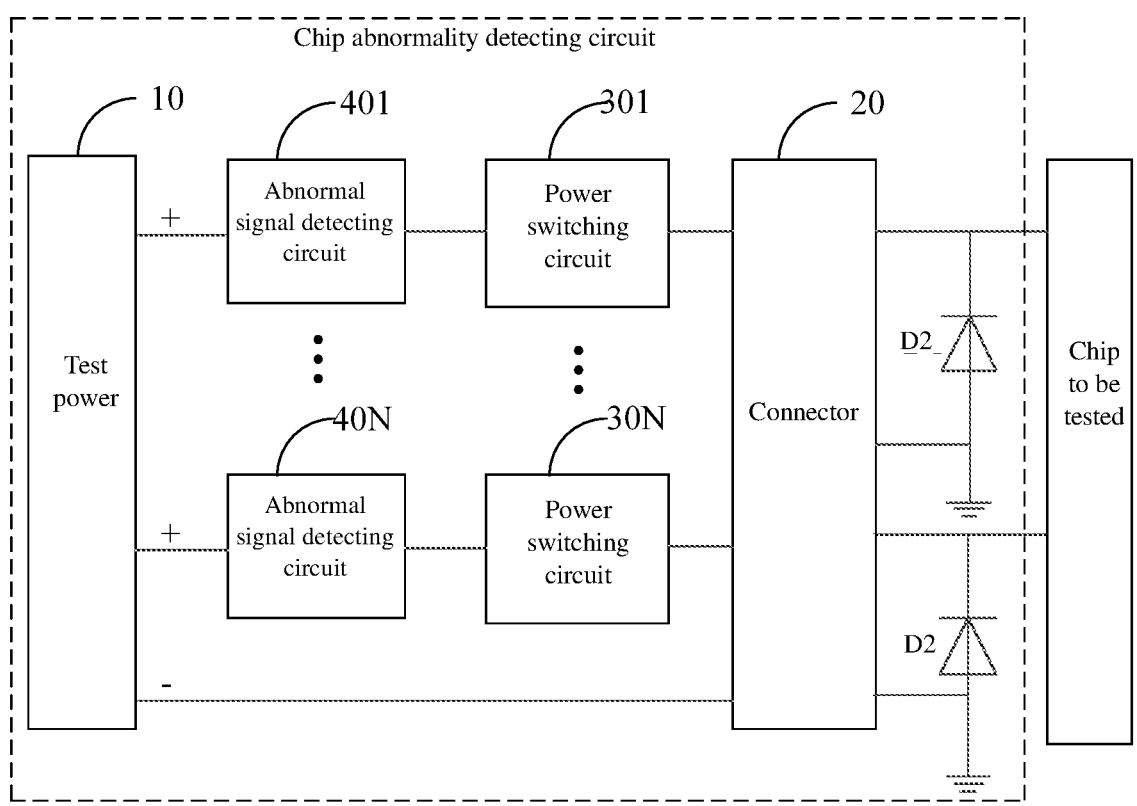
FIG. 3 is a structural view of another embodiment of a chip abnormality detecting circuit of the present disclosure.

In order to solve the above problem, referring to FIG. 1 to FIG. 3, in an embodiment of the present disclosure, the chip abnormal signal detecting circuit includes:

a test power 10 configured to provide a test current to the chip to be tested;

a connector 20 including a signal output terminal and a ground terminal, the signal output terminal being configured to connect a function pin of the chip to be tested and a cathode of the ESD protection diode D2, the ground terminal being configured to connect a ground pin of the chip to be tested and an anode of the ESD protection diode D2:

a power switching circuit 30 disposed in series between the test power 10 and the signal output terminal of the connector 20, the power switching circuit 30 being configured to output the test current provided by the test power 10 to the signal output terminal of the connector 20 when turned on; and an abnormal signal detecting circuit 40, of which a detection end is connected to an input end of the power switching circuit 30, configured to detect a reverse cutoff characteristic of the ESD protection diode D2 of the chip to be tested, and output a corresponding detection signal.

In the present embodiment, the test power 10 may be a DC power source for the chip to operate, for example, a 5V or 12V output power for driving the timing controller, and the test power 10 may also be implemented using a battery such as a lithium battery, a secondary rechargeable dry battery, a button battery, or the like. The voltage output by the test power 10 is less than the voltage at which the ESD protection diode D2 is broken down, that is, less than its breakdown voltage.

The connector 20 has a plurality of terminals, and the plurality of terminals are respectively connected to the pins of the chip to be tested, such as the timing controller or the pins of the power chip. The number of the terminals of the connector 20 is matched with the chip pins, and may be set according to the number of pins of the chip, which is not limited herein.

The power switching circuit 30 is controlled based on an externally input control signal, such as a switch signal triggered by a user based on a button circuit, and when the power switching circuit 30 is turned on, the test power 10 is output to the signal output terminal of the connector 20 to implement abnormality detection of the ESD protection diode D2.

The abnormal signal detecting circuit 40 can be implemented by using a signal output component such as a light emitting diode D1 and a buzzer, etc. Optionally, the present disclosure adopts the light emitting diode D1. The light emitting diode D1 is disposed in series between the test power 10 and the power switching circuit 30, that is, the anode of the light emitting diode D1 is connected to the positive output terminal of the test power 10, and the cathode is connected to the power switching circuit 30. When the output current of the test power 10 constitutes a current loop, the light emitting diode D1 is turned on, and vice versa.

In a specific embodiment, the positive output end of the test power 10 is connected to the input end of the power switching circuit 30, and the output end of the power switching circuit 30 is connected to the cathode of the ESD protection diode D2 via the signal output terminal of the connector 20; the negative output terminal of the test power 10 is connected to the anode of the ESD protection diode D2 via the ground terminal of the connector 20, that is, when the power switching circuit 30 is turned on, the current output from the positive output terminal of the test power 10 is output to the cathode of the ESD protection diode D2 via the power switching circuit 30 and the signal output terminal of the connector 20. If the ESD protection diode D2 operates normally, that is, no abnormality occurs, and since the test current is less than its breakdown voltage, it is in the off state. At this time, the current output by the test power 10 is reversely cut-off by the ESD protection diode D2; the negative input terminal of the test power 10 is connected to the anode of the ESD protection diode D2 via the ground terminal of the connector 20, and a current loop may not be formed between the test power 10 and the ESD protection diode D2. At this time, the light emitting diode D1 in the abnormal signal detecting circuit 40 may not operate, characterized in that the ESD protection diode D2 is normal at this time. If the ESD protection diode D2 is broken to be characterized by having low resistance, that is, abnormality occurs, at this time, the current output by the test power 10 is back to the negative input end of the test power 10 via the ESD protection diode D2 and the ground terminal of the connector 20, and a current loop may be formed between the test power 10 and the ESD protection diode D2. At this time, the light emitting diode D1 in the abnormal signal detecting circuit 40 is lit, characterized in that an abnormality occurs in the ESD protection diode D2.

By disposing a connector 20, the present disclosure connects sequentially the test power 10, the abnormal signal detecting circuit 40 and the power switching circuit 30 to the cathode of the ESD protection diode D2 through the connector 20, the cathode of the ESD protection diode D2 and the anode of the ESD protection diode D2, and when the power switching circuit 30 is turned on, the test current provided by the test power 10 forms a current loop with the test power source 10, the abnormal signal detection circuit 40, and the power switching circuit 30 via the ESD protection diode D2 to test the reverse cutoff characteristic of the ESD protection diode D2 of the chip to be tested while outputting a corresponding detection signal. In the present disclosure, the automatic detection of the characteristic value of the diode corresponding to the ESD protection diode D2 may be realized without a hand-held measuring tool. Moreover, in the present disclosure, by disposing the abnormal signal detecting circuit 40 in series in the detecting loop, the test worker may intuitively know the detection result and the detection efficiency is improved.

Referring to FIGS. 1 to 3, in an optional embodiment, the chip abnormality detecting circuit further includes a screen detecting switching circuit 50; an input end CV-in of the screen detecting switching circuit 50 is configured to be accessed to a screen detection signal, and an output end of the screen detecting switching circuit 50 is connected to the signal output terminal of the connector 20; the screen detecting switching circuit 50 is configured to output the accessed screen detection signal to the signal output terminal of the connector 20 when turned on.

In the present embodiment, the input terminal CV-in of the screen detecting switching circuit 50 is connected to a driving signal for screen detection of the display device, for example, the input terminal CV-in of the screen detecting switching circuit 50 may be connected to the main control board of the display device, to access the power or data signals, control signals, etc. that drive the display panel. It may be specifically set according to the type of test chip, for example, when the connector 20 is connected to the power management integrated chip, those output by the main control board are power; when the connector 20 is connected to the timing controller, the main control board outputs a data signal, a control signal or a timing control signal; the screen detecting switching circuit 50 is controlled based on an externally input control signal, such as a switch signal triggered by a user based on a button circuit, and when it is turned on, the data signal or the control signal is output to the signal output terminal of the connector 20 to implement screen abnormality detection of the display panel.

Referring to FIGS. 1 to 3, in an optional embodiment, the chip abnormal signal detecting circuit further includes a switch control circuit 60, and an output end of the switch control circuit 60 is respectively connected to a controlled end of the power switching circuit 30 and a controlled end of the screen detecting switching circuit 50; the switch control circuit 60 is configured to output a first level signal and a second level signal having mutually opposite polarities to control the power switching circuit 30 to be turned on when receiving the first level signal and to control the screen detecting switching circuit 50 to be turned on when receiving the second level signal.

In the present embodiment, the switch control circuit 60 may generate correspondingly a first level signal and a second level signal according to a user's triggered key command. The button command may be one or two. When the command is set to one, a pulse signal may be generated according to the button command, and the period and duty ratio of the pulse signal may be set according to the test requirements. When it is set to two, the output may be corresponding according to the user's triggered command. For example, when the screen abnormality detection is performed, the first level signal is output, and when the ESD protection diode D2 is abnormal, the second level signal is output. In this way, the abnormality detection of the screen of the display panel may be realized, and the ESD protection diode D2 of the chip is detected for abnormality.

The switch control circuit 60 may be implemented by using a switch circuit such as a DIP switch (not shown), a single-pole double-throw switch, and a touch screen. Optionally, the present disclosure adopts the DIP switch, and the DIP switch is configured to output the first level signal or the second level signal according to the triggered command of the switch received when triggered.

Referring to FIGS. 1 to 3, in an optional embodiment, the screen detecting switching circuit 50 includes a first switch transistor Q1; an input end of the first switch transistor Q1 is the input end Cv-in of the screen detecting switching circuit 50, an output end of the first switch transistor Q1 is the output end of the screen detecting switching circuit 50, and a controlled end of the first switch transistor Q1 is the controlled end of the screen detecting switching circuit 50.

In the present embodiment, the first switch transistor Q1 may be implemented by a switch such as a triode, a field effect transistor, or a double gate insulating transistor. The present embodiment may be implemented optionally by an N-type field effect transistor. The N-type FET is turned on when receiving the first level signal of the high level, is turned off when the second level signal of the low level is received, and outputs a driving signal for display panel test to the signal output terminal of the connector 20 when turned on.

Referring to FIGS. 1 to 3, in an optional embodiment, the power switching circuit 30 includes a second switch transistor Q2; an input end of the second switch transistor Q2 is the input end of the power switching circuit 30, an output end of the second switch transistor Q2 is the output end of the power switching circuit 30, and a controlled end of the second switch transistor Q2 is the controlled end of the power switching circuit 30.

In the present embodiment, the second switch transistor Q2 may be implemented by a switch such as a triode, a field effect transistor, or a double gate insulating transistor. The present embodiment may be implemented optionally by an P-type field effect transistor. The P-type FET is turned on when receiving the second level signal of the low level, is turned off when the first level signal of the high level is received, and outputs a current signal output by the test power 10 to the signal output terminal of the connector 20 when turned on.

Referring to FIGS. 1 to 3, in an optional embodiment, the number of the signal output terminal is plural;

the power switching circuit 30 includes a plurality of power switching branches (labeled 301, 302 . . . 30N, respectively), and the output ends of the plurality of power switching branches are connected with the plurality of power switching branches one-to-one:

the abnormal signal detecting circuit 40 includes a plurality of abnormal signal detecting branches (labeled 401, . . . 40N, respectively), and the detecting end of each of the abnormal signal detecting branches (not shown) is connected with the input end of one of the power switching branches.

In the present embodiment, the power switching circuit 30, the abnormal signal detecting circuit 40, and the above-mentioned screen abnormality may be provided with a plurality of branches. The connector 20 has a plurality of terminals, and the plurality of terminals are respectively connected to the pins of the chip to be tested, such as the timing controller or the pins of the power chip. The number of the terminals of the connector 20 is matched with the chip pins, and may be set according to the number of pins of the chip, which is not limited herein. The abnormal signal detecting circuit 40 and the power switching circuit 30 are sequentially disposed in series between the positive output end of the test power 10 and a signal output terminal of the connector 20 to test the diode characteristics of the chip ESD protection diode D2, thereby implementing the abnormality test of the ESD protection diode D2 When the screen detecting switching circuit 50 is provided with a plurality of screen detecting switching branches, the input ends thereof may input corresponding driving signals, control signals or driving powers, and output above signals or driving powers to each signal output terminal of the connector 20 when each of the screen detecting switching branches is turned on, thereby outputting to the chip to be tested, so that the test for screen abnormality of display panel is implemented.

The present disclosure further provides a chip abnormal signal detecting circuit applied to abnormality detection of a chip disposed with an ESD protection diode D2.

Referring to FIG. 1 to FIG. 3, the chip abnormal signal detecting circuit includes:

a test power 10 configured to provide a test current to the chip to be tested;

a connector 20 including a ground terminal and a plurality of signal output terminals, the plurality of signal output terminals being configured to connect a plurality of function pins of the chip to be tested and cathodes of a plurality of ESD protection diodes D2, the ground terminal being configured to connect a ground pin of the chip to be tested and an anode of the ESD protection diode D2;

a power switching circuit 30 including a plurality of second switch transistors Q2, and the output ends of the plurality of second switch transistors Q2 are connected in one-to-one correspondence with the plurality of signal output terminals; each of the second switch transistors Q2 is configured to output the test current provided by the test power 10 to the signal output terminal corresponding to the connector 20, when turned on; and an abnormal signal detecting circuit 40 including a plurality of light emitting diodes D1; an anode of each of the light emitting diodes D1 is connected to a positive output end of the power supply, and the cathodes of the plurality of the light emitting diodes D1 are connected in one-to-one correspondence with the input ends of the plurality of the second switching transistors Q2.

By disposing a connector 20, the present disclosure connects sequentially the test power 10, the abnormal signal detecting circuit 40 and the second switch transistor Q2 to the cathode of the ESD protection diode D2 through the connector 20, the cathode of the ESD protection diode D2 and the anode of the ESD protection diode D2, and when the second switch transistor Q2 is turned on, the test current provided by the test power 10 forms a current loop with the test power source 10, the light emitting diode D1, and the second switch transistor Q2 via the ESD protection diode D2 to test the reverse cutoff characteristic of the ESD protection diode D2 of the chip to be tested while outputting a corresponding detection signal. In the present disclosure, the automatic detection of the characteristic value of the diode corresponding to the ESD protection diode D2 may be realized without a hand-held measuring tool. Moreover, in the present disclosure, by disposing the light emitting diodes D1 in series in the detecting loop, the test worker may intuitively know the detection result through on/off states of the light-emitting diode D1 and the detection efficiency is improved. The application may perform batch test on the ESD protection diode D2 of the chip to be tested through multiple detection loops.

The present embodiment further provides a chip abnormality detecting device which includes the chip abnormality detecting circuit as described above. The detailed structure of the chip abnormality detecting circuit may be referred to the above embodiment and will not be repeated here. It can be understood that since the above chip abnormality detecting circuit is used in the chip abnormality detecting device of the present disclosure, the embodiments of the chip abnormality detecting device of the present disclosure include all the technical solutions of all the embodiments of the chip abnormality detecting circuit described above, and the technical effects achieved are also completely the same, and will not be repeated here.

The above mentioned is only the optional embodiment of the present disclosure, which does not limit the patent scope of the present disclosure, and any equivalent structure transformation made by using the specification and the drawings of the present invention or direct/indirect applications in other related technical fields should be contained in the scope of patent protection in a similar way.

What is claimed is:

1. A chip abnormality detecting circuit, applied to abnormality detection of a chip disposed with an ESD protection diode, wherein the chip abnormality detecting circuit comprises:

a test power configured to provide a test current to the chip to be tested;

a connector comprising a signal output terminal and a ground terminal, the signal output terminal being configured to connect a function pin of the chip to be tested and a cathode of the ESD protection diode, the ground terminal being configured to connect a ground pin of the chip to be tested and an anode of the ESD protection diode;

a power switching circuit disposed in series between the test power and the signal output terminal of the connector, the power switching circuit being configured to output the test current provided by the test power to the signal output terminal of the connector when turned on;

an abnormal signal detecting circuit, of which a detection end is connected to an input end of the power switching circuit, configured to detect a reverse cutoff characteristic of the ESD protection diode of the chip to be tested, and output a corresponding detection signal; and a screen detecting switching circuit, wherein an input end of the screen detecting switching circuit is configured to be accessed to a screen detection signal, and an output end of the screen detecting switching circuit is connected to the signal output terminal of the connector; the screen detecting switching circuit is configured to output the accessed screen detection signal to the signal output terminal of the connector when turned on.

2. The chip abnormality detecting circuit according to claim 1, wherein the chip abnormality detecting circuit further comprises a switch control circuit, and an output end of the switch control circuit is respectively connected to a controlled end of the power switching circuit and a controlled end of the screen detecting switching circuit; the switch control circuit is configured to output a first level signal and a second level signal having mutually opposite polarities to control the power switching circuit to be turned on when receiving the first level signal and to control the screen detecting switching circuit to be turned on when receiving the second level signal.

3. The chip abnormality detecting circuit according to claim 2, wherein the switch control circuit includes a DIP switch, and the DIP switch is configured to output the first level signal or the second level signal when triggered.

4. The chip abnormality detecting circuit according to claim 2, wherein the screen detecting switching circuit includes a first switch transistor; an input end of the first switch transistor is the input end of the screen detecting switching circuit, an output end of the first switch transistor is the output end of the screen detecting switching circuit, and a controlled end of the first switch transistor is the controlled end of the screen detecting switching circuit.

5. The chip abnormality detecting circuit according to claim 4, wherein the first switch transistor is an N-type field effect transistor.

6. The chip abnormality detecting circuit according to claim 2, wherein the power switching circuit includes a second switch transistor; an input end of the second switch transistor is the input end of the power switching circuit, an output end of the second switch transistor is an output end of the power switching circuit, and a controlled end of the second switch transistor is the controlled end of the power switching circuit.

7. The chip abnormality detecting circuit according to claim 6, wherein the second switch transistor is an P-type field effect transistor.

8. The chip abnormality detecting circuit according to claim 1, wherein the abnormal signal detecting circuit includes a light emitting diode; an anode of the light emitting diode is connected to a positive output end of the test power, and a cathode of the light emitting diode is the detection end of the abnormal signal detecting circuit.

9. The chip abnormality detecting circuit according to claim 1, wherein,
the connector comprises a plurality of signal output terminals;
the power switching circuit includes a plurality of power switching branches, and output ends of the plurality of power switching branches are connected with the plurality of signal output terminals one-to-one; and
the abnormal signal detecting circuit includes a plurality of abnormal signal detecting branches, and a detection end of each of the abnormal signal detecting branches is connected with an input end of one of the power switching branches.

10. The chip abnormality detecting circuit according to claim 9, wherein the screen detecting switching circuit includes a plurality of screen detecting switching branches, input ends of the plurality of screen detecting switching branches are configured to input corresponding driving signals, control signals or driving powers, and the driving signals, the control signals or the driving powers are output to each signal output terminal of the connector when each of the screen detecting switching branches is turned on.

11. A chip abnormality detecting device comprising the chip abnormality detecting circuit according to claim 1.

12. The chip abnormality detecting device according to claim 11, wherein, the power switching circuit comprises a plurality of second switch transistors, and output ends of the plurality of second switch transistors are connected in one-to-one correspondence with a plurality of signal output terminals; each of the plurality of second switch transistors is configured to output the test current provided by the test power to a corresponding one of the plurality of the signal output terminals of the connector, when turned on; and
the abnormal signal detecting circuit includes a plurality of light emitting diodes; an anode of each of the plurality of light emitting diodes is connected to a positive output end of the test power, and cathodes of the plurality of light emitting diodes are connected in one-to-one correspondence with input ends of the plurality of second switching transistors.

13. A chip abnormality detecting circuit, applied to abnormality detection of a chip disposed with a plurality of ESD protection diodes, wherein the chip abnormality detecting circuit comprises:
a test power configured to provide a test current to the chip to be tested;
a connector including a ground terminal and a plurality of signal output terminals, the plurality of signal output terminals being configured to connect a plurality of function pins of the chip to be tested and cathodes of the plurality of ESD protection diodes, the ground terminal being configured to connect a ground pin of the chip to be tested and anodes of the plurality of ESD protection diodes;
a power switching circuit including a plurality of second switch transistors, wherein output ends of the plurality of second switch transistors are connected in one-to-one correspondence with the plurality of signal output terminals; each of the second switch transistors is configured to output the test current provided by the test power to a corresponding one of the plurality of signal output terminals of the connector, when turned on;
an abnormal signal detecting circuit including a plurality of light emitting diodes; wherein an anode of each of the plurality of light emitting diodes is connected to a positive output end of the test power, and cathodes of the plurality of light emitting diodes are connected in one-to-one correspondence with input ends of the plurality of second switching transistors; and
a screen detecting switching circuit comprising a plurality of screen detecting switching branches, wherein input ends of the screen detecting switching branches are configured to input corresponding driving signals, control signals or driving powers, and the driving signals, the control signals or the driving powers are output to each of the plurality of signal output terminals of the connector when each of the plurality of screen detecting switching branches is turned on.

\* \* \* \* \*